United States Patent [19]

Ebersole

[11] Patent Number: 5,324,620
[45] Date of Patent: Jun. 28, 1994

[54] RADIATION-SENSITIVE COMPOSITIONS CONTAINING NOVOLAK POLYMERS MADE FROM FOUR PHENOLIC DERIVATIVES AND AN ALDEHYDE

[75] Inventor: Charles E. Ebersole, Cheshire, Conn.

[73] Assignee: OCG Microeletronic Materials, Inc., West Paterson, N.J.

[21] Appl. No.: 97,426

[22] Filed: Jul. 26, 1993

Related U.S. Application Data

[60] Division of Ser. No. 713,891, Jun. 12, 1991, Pat. No. 5,237,037, which is a continuation-in-part of Ser. No. 553,483, Jul. 13, 1990, abandoned, which is a continuation-in-part of Ser. No. 405,802, Sep. 8, 1989, abandoned.

[51] Int. Cl.$^5$ .................. G03F 7/023; G03F 7/30
[52] U.S. Cl. .................. 430/192; 430/165; 430/191; 430/193; 430/270; 430/326
[58] Field of Search .............. 430/191, 192, 193, 165, 430/270, 326

[56] References Cited

U.S. PATENT DOCUMENTS 4,173,290  11/1979  Kobayashi et al. ............... 220/678

(List continued on next page.)

FOREIGN PATENT DOCUMENTS 0227487  12/1986  European Pat. Off. .

(List continued on next page.)

OTHER PUBLICATIONS

Solid State Technology, Jun., 1984, pp. 115–120, T. R. Pampalone "Novolak Resins Used in Positive Resist Systems".

(List continued on next page.)

Primary Examiner—Charles L. Bowers, Jr.
Assistant Examiner—John S. Chu
Attorney, Agent, or Firm—William A. Simons

[57] ABSTRACT

A radiation-sensitive composition dissolved in a solvent comprising:
(A) a photoactive compound;
(B) an alkali-soluble novolak binder resin made by the condensation reaction of a mixture of phenolic monomers and phenolic dimers with an aldehyde source, said mixture of phenolic monomers and phenolic dimers comprising:
  (1) 2–25% by weight of said mixture being at least one monofunctinal phenolic monomer;
  (2) about 98–75% by weight of said mixture comprising a mixture of difunctional phenolic monomers or dimers comprising:
    (a) about 0.1% to about 25% by weight of said total mixture being ortho-mono(lower alkyl) phenol;
    (b) about 10% to about 50% by weight of said total mixture being selected from the group consisting of a para-mono-substituted (lower alkyl) phenol, 2,2'-dihydroxy-5,5'-di(lower alkyl) diphenyl methane, 3,4-di(lower alkyl) phenol, 5-indanol, 3,4,5-tri(lower alkyl) phenol, and mixtures thereof;
    (c) about 30% to about 80% by weight of the total mixture being 2,3,5-tri(lower alkyl) phenol, 2,3-di(lower alkyl) phenol, 2,5-di(lower alkyl) phenol, and mixtures thereof.

the amount of said aldehyde source being at least a stoichiometric amount to react with all of said phenolic moieties; and wherein the photoactive compound makes up from about 5% to about 40% by weight of the solids in said radiation-sensitive composition; and the alkali-soluble novolak resin makes up from about 95% to about 60% by weight of the solids in said radiation-sensitive composition.

12 Claims, No Drawings

U.S. PATENT DOCUMENTS

| | | |
|---|---|---|
| 4,529,682 | 7/1985 | Toukhy .................. 430/190 |
| 4,719,167 | 1/1988 | Miura et al. .................. 430/192 |
| 4,725,523 | 2/1988 | Mitsubishi Chemical Indus. .................. 430/192 |
| 4,812,551 | 3/1989 | Sumitomo Chemical Co. ... 430/165 |
| 4,839,457 | 6/1989 | Mitsubishi Petrochemical Co. .................. 528/86 |
| 4,859,563 | 8/1989 | Miura et al. .................. 430/193 |
| 4,906,549 | 3/1990 | TOK .................. 430/192 |
| 4,957,846 | 9/1990 | Jeffries et al. .................. 430/165 |
| 4,965,167 | 10/1990 | Salamy .................. 430/191 |
| 4,971,887 | 11/1990 | Hoechst .................. 430/165 |
| 4,988,601 | 1/1991 | Toshiba .................. 430/192 |
| 4,992,356 | 2/1991 | Jeffries et al. .................. 430/326 |
| 4,992,596 | 2/1991 | Jeffries et al. .................. 430/165 |
| 5,110,706 | 5/1992 | Yumoto et al. .................. 430/192 |

FOREIGN PATENT DOCUMENTS

| | | |
|---|---|---|
| 0239423 | 3/1987 | European Pat. Off. . |
| 55-126250 | 9/1980 | Japan . |
| 60-164740 | 8/1985 | Japan . |
| 61-185741 | 8/1985 | Japan . |
| 60-176034 | 9/1985 | Japan . |
| 61-275748 | 9/1985 | Japan . |
| 62-089040 | 4/1987 | Japan . |
| 62-121754 | 6/1988 | Japan . |
| 60158440 | 8/1989 | Japan . |

OTHER PUBLICATIONS

Chen and Rice, "Study of Dryout Resistance of Phenolic Copolymer Resins for Pine Plywood Glues—Parts I and II", Forest Products Journal, vol. 24, No. 3, pp. 20–26 (Mar., 1974) and vol. 25, No. 6, pp. 40–44 (Jun., 1975).

Hanabata, Funita, Uemura "Novolak Design for High Resolution Positive Photoresists" 1977 SPIE Conference, vol. 771, Advances in Resist Technology and Processing (IV), pp. 85–92.

RADIATION-SENSITIVE COMPOSITIONS CONTAINING NOVOLAK POLYMERS MADE FROM FOUR PHENOLIC DERIVATIVES AND AN ALDEHYDE

CROSS-REFERENCE TO RELATED APPLICATIONS

This application is a divisional application of U.S. patent application Ser. No. 07/713,891, filed on Jun. 12, 1991, now U.S. Pat. No. 5,237,037 issued Aug. 17, 1992, which is a continuation-in-part application of U.S. patent application Ser. No. 07/553,483 filed on Jul. 13, 1990 and now abandoned, which is a continuation-in-part application of U.S. patent application Ser. No. 07/405,802 filed Sep. 8, 1989 and now abandoned. All of these parent applications are incorporated herein by reference in their entireties.

BACKGROUND OF THE INVENTION

1. Field of the Invention

The present invention is directed to radiation-sensitive compositions useful as photoresists containing fully substituted novolak polymers.

2. Brief Description of the Prior Art

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate. In some instances, it may be desirable to bake the imaged coated substrate after the imaging step and before the developing step. This bake step is commonly called a post-exposure bake and is used to increase resolution.

There are two types of photoresist compositions—negative-working and positive working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g. a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresists are generally prepared by blending a suitable alkali-soluble binder resin (e.g., a phenol-formaldehyde novolak resin) with a photoactive compound (PAC) which converts from being insoluble to soluble in an alkaline aqueous developer solution after exposure to a light or energy source. The most common class of PAC's employed today for positive-working resists are quinone diazide esters of a polyhydroxy compound. Typical novolak resins used today for positive-working resins are made from various mixtures of ortho-cresol, meta-cresol, and para-cresol which are condensed with an aldehyde source (e.g., formaldehyde).

Positive-working photoresist compositions are currently favored over negative-working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of one micron or less is necessary.

In addition, it is generally desirable that the developed photoresist wall profiles be near vertical relative to the substrate. Such demarcations between developed and undeveloped areas of the resist coating translate into accurate pattern transfer of the mask image onto the substrate.

Increased resolution has been noted in positive photoresist systems whose novolaks possess a high degree of ortho-, ortho-bonding. The term ortho-, ortho-bonding is used to refer to the location and positions of attachment of the methylene bridge between phenolic nuclei. Thus, the methylene bridge which connects two phenolic nuclei which is ortho to both phenolic hydroxyl groups is regarded as ortho, ortho.

It is thought that ortho-, ortho-bonding increases the interactions between phenolic hydroxyls in the novolak and the photoactive compound in positive photoresists compared to positive photoresists containing novolaks which lack a high degree of ortho-, ortho-bonding in their micro-structure. Although the exact character of these interactions is speculative, e.g., hydrogen bonding, van der Waals forces, and the like, there is a correlation between increased resolution and contrast observed in these positive resists whose novolaks contain a high degree of ortho-, ortho-bonding compared to positive resists whose novolaks lack this high degree of ortho-, ortho-bonding.

The optimum number of ortho-, ortho-bonds necessary for optimum interaction between the PAC and the novolak not known. However, it is noted that novolak resins which have a very high percentage or ortho-, ortho-bonding (e.g., a very high content of para-cresol in the novolak) appear to result in photoresists having scum (i.e., undesired residues in the exposed and unexposed areas). Accordingly, having the optimum number of ortho, ortho bonds distributed properly may minimize or eliminate this scum problem.

Besides the positioning of the methylene bridge in the novolak resin, it has been found that the presence of phenolic dimer, trimer, and lower oligomeric moieties in the novolak resin may also result in scum formation in the formed and developed images. Further, the presence of these dimers and the like also adversely affect the thermal properties of the final resist and adversely affect the dissolution times of the novolak in the developer solution. Accordingly, it is desirable to remove or prevent the formation of such undesirable moieties from the novolak resin solution before adding it into the photoresist composition.

Also, the formation of scum at the bottom of developed images has also been found to be attributed to the formation of azo-coupling products between the PAC molecule and unreacted 2-, 4-, and 6-position of the novolak phenols (i.e., where the 1-position of the phenol ring is the hydroxy position). The remaining 3- and 5-positions are relatively unreactive under both polymerization reaction conditions and azo coupling reaction conditions.

Accordingly, the present invention is directed to substantially eliminating all of the above-noted three causes of scum formation by a combination of several novolak-forming parameters.

First, the need for a sufficient but not excessive amount of ortho-, ortho-bonding is provided for by employing certain proportions of para-substituted difunctional phenolic moieties (e.g., para-cresol) in the phenolic monomeric mixture used to make the novolak resin.

Second, the unwanted dimers, trimers, and lower oligomers are substantially eliminated by using a molar excess of aldehyde source to total phenolic monomers, as well as employing a certain low proportion of monofunctional phenolic monomers as terminal groups for the novolak resin.

Third, the unwanted azo-coupling reaction can be substantially eliminated by preblocking substantially all of the reactive 2-, 4-, and 6- positions in the novolak resin.

This preblocking can be accomplished by selecting certain proportions of monofunctional, difunctional, and optionally trifunctional phenolic monomers or dimers. Monofunctional phenolic monomers are compounds which have only one 2-, 4-, or 6-position relative to the hydroxy group open or unsubstituted to reaction with other phenolic moieties during the novolak polymerization reaction with the phenolic moieties. Examples of monofunctional phenolic monomers are 2,4-dimethylphenol (also known as (2,4-xylenol) and 2,6-dimethylphenol (also known as 2,6-xylenol). Each has only one reactive site, namely the 6- and 4-positions, respectively. The difunctional phenolic monomers and dimers are compounds which have a total of two 2-, 4-, and 6-positions relative to hydroxy groups in the molecule available for reaction. An example of a difunctional phenolic monomer is 4-methylphenol (also known as para-cresol). It has both the 2- and 6-positions open to reaction. An example of a difunctional phenolic dimer is ortho-ortho bonded p-cresol dimer or 2,2'-dihydroxy-5,5'-dimethyldiphenyl methane. It has a single open reactive site on each phenolic ring namely one ortho to each hydroxy group.

If a novolak resin is made by condensing an aldehyde source with the correct relative proportion of monofunctinal and difunctional phenolic monomers, one would obtain a novolak resin wherein the interior phenolic moieties were difunctional moieties and the terminal phenolic groups were monofunctional in nature. It should be noted that monofunctional moieties must be terminal groups since once the single available reactive site is reacted during the novolak polymerization step, then there is no further reaction site on that monomeric moiety. In contrast, the difunctional phenolic monomers or dimers must be internal moieties on the novolak chain since the two available reactive sites will react with other phenolic moieties.

If trifunctional phenolic moieties are also used to make novolak resins, they have all three 2-, 4-, and 6-position reactive sites open for reaction. Examples of trifunctional phenolic monomers include 3-methylphenol (also known as meta-cresol) and 3,5-dimethylphenol (also known as 3,5-xylenol). The use of trifunctional phenolic monomers causes branching in the novolak resin. If too much trifunctional phenolic monomers is used in the novolak polymerization reaction, extensive cross-linking of the novolak resin chains will occur resulting in the formation of high molecular weight insoluble material. However, some branching may be preferred in some cases because it appears to provide the resultant novolak resin with higher thermal resistance properties.

Accordingly, there is a need to make novolak resins which substantially eliminate the formation of scum in the developed images, yet have sufficient high thermal resistance properties to be useful in positive-working photoresists. The present invention is believed to be a solution to that need.

BRIEF DESCRIPTION OF THE INVENTION

Accordingly, the present invention is directed to an alkali-soluble novolak binder resin made by the condensation reaction of a mixture of phenolic monomers and phenolic dimers with at least one aldehyde source, said mixture of phenolic monomers and phenolic dimers comprising:

(1) about 2-25% by weight of said mixture being at least one monofunctional phenolic monomer; and
(2) about 98-75% by weight of said mixture comprising a mixture of difunctional phenolic monomers or dimers comprising:
  (a) about 0.1% to about 25% by weight of said total mixture (i.e., sum of all of the phenolic precursors) being ortho-mono(lower alkyl) phenol;
  (b) about 10% to about 50% by weight of said total mixture being selected from the group consisting of a para-(lower alkyl) phenol, 2,2'-dihydroxy-5,5'- di(lower alkyl) diphenyl methane, 3,4-di(lower alkyl) phenol, 5-indanol, 3,4,5-tri(lower alkyl) phenol, and mixtures thereof; and (c) about 30% to about 80% by weight of the total mixture being 2,3,5-tri(lower alkyl) phenol, 2,3-di(lower alkyl) phenol, 2,5-di (lower alkyl) phenol, and mixtures thereof;

the amount of said aldehyde source being at least a stoichiometric amount to react with all of said phenolic moieties.

Furthermore, the present invention is directed to a radiation-sensitive composition useful as a positive-working photoresist dissolved in a solvent comprising:
A. a photoactive compound; and
B. an alkali-soluble novolak binder resin made by the condensation reaction of a mixture of phenolic monomers and phenolic dimer with an aldehyde source, said mixture of phenolic monomers and phenolic dimers comprising:

(1) about 2–25% by weight of said mixture being at least one monofunctional phenolic monomer; and
(20 about 98–75% by weight of said mixture comprising a mixture of difunctional phenolic monomers or dimers comprising:

(a) about 0.1% to about 25% by weight of said total mixture being ortho-mono(lower alkyl) phenol;

(b) about 10% to about 50% by weight of said total mixture being selected from the group consisting of a para-(lower alkyl) phenol, 2,2'-dihydroxy-5,5'-di(lower alkyl) diphenyl methane, 3,4-di(lower alkyl) phenol, 5-indanol, 3,4,5-tri(lower alkyl) phenol, and mixtures thereof; and (c) about 30% to about 80% by weight of the total mixture being 2,3,5-tri(lower alkyl) phenol, 2,3-di(lower alkyl) phenol, 2,5-di(lower alkyl) phenol, and mixtures thereof.

the amount of said aldehyde source being at least a stoichiometric amount to react with all of said phenolic moieties; and wherein the photoactive compound makes up from about 5% to about 40% by weight of the solids of said radiation-sensitive composition; and the alkali-soluble novolak resin makes up from about 95% to about 60% by weight of the solids in said radiation-sensitive composition.

DETAILED DESCRIPTION

As stated above, the present invention is drawn to a class of novolak resins and positive-working photoresists made therefrom. These novolak resins are prepared from selected mixtures of monofunctional and difunctional phenolic monomers and phenolic dimers.

A monofunctional phenolic monomer is defined herein as a phenolic compound having one phenyl ring and only one reactive site either ortho- or para- to the hydroxyl group. In other words, there is only one reactive site on the phenol ring for electrophilic aromatic substitution. Preferred examples of monofunctional groups include 2,4-dimethylphenol, 2,6-dimethylphenol, and 2,3,4-trimethylphenol, and 2,3,6-trimethylphenol. The stated purpose of having these monofunctional phenolic monomers is as chain terminators.

A difunctional phenolic monomer is defined herein as a phenolic component having one phenol ring and having two reactive sites, ortho- or para-, to the hydroxyl group. Preferred examples of difunctional monomers are: p-cresol, o-cresol, 2,3-dimethylphenol, 3,4-dimethylphenol, 2,3,5-trimethylphenol, and 3,4,5-trimethylphenol. A multi-ring compound, 5-indanol, is also a suitable difunctional monomer. The stated purpose of these difunctional monomers is as internal chain building blocks.

A difunctional phenolic dimer is defined herein as a phenolic compound having two phenol rings having a total of two reactive sites, ortho- or para-, to the two or more hydroxyl groups. Preferably, there is one reactive site on each phenol ring. A preferred example of a difunctional dimer is 2,2'-dihydroxy-5,5'-dimethyldiphenylmethane (also called p-cresol dimer). The purpose of these dimers is the same as the difunctional monomers.

A trifunctional phenolic monomer is defined herein as a phenolic compound having one phenolic ring with three reactive sites, ortho- or para-, to the hydroxyl. Preferred examples include m-cresol, ortho-, ortho-bonded i-m-cresol, phenol, 3,5-dimethylphenol, resorcinol, and the like. These trifunctional phenolic monomers may be used as branch points in the novolak resin chain.

Tetrafunctional phenolic dimers are defined as phenolic compounds having two phenol rings having a total of four open reactive sites, ortho- or para-, to the hydroxyl. The purpose is the same as the trifunctional phenolic monomer, namely, to be a branching point.

If it is desired to employ either a trifunctional phenolic monomer or tetrafunctional phenolic dimers in the present novolaks, they may be employed from 0% to about 15% by weight of the total phenolic mixture. The present invention encompasses a mixture of a monofunctional phenolic monomer or monomers with three separate classes of difunctional monomers. Ortho-mono- substituted lower alkyl phenols are the first class of difunctional phenolic monomer. They are used to provide flexibility to the novolak resin. The second class includes para-substituted lower alkyl phenols, dimers, and multi-ring compounds. These are used to provide the ortho-, ortho-bonding to the novolak resin. The third class includes ortho di-substituted lower alkyl phenols (e.g., 2,3-dimethylphenol) and ortho-tri-substituted lower alkyl phenols (e.g., 2,3,5-trimethylphenol). These aid in the novolaks ability to withstand heat deformation during the lithographic process.

The preferred and most preferred ranges of the monofunctional monomer and three classes of difunctional monomers in the total mixture of phenolic moieties used to make the resin are as follows:

| Type of Monomer | Preferred Percentage Range | Most Preferred Percentage Range |
|---|---|---|
| Monofunctional | about 3–22 | about 4–20 |
| Ortho-mono-substituted (lower alkyl) phenols | about 0.5–15 | about 1–12 |
| Para-substituted lower alkyl phenols, dimers, and multi-ring compounds | about 12–45 | about 15–40 |
| Ortho-di-substituted lower alkyl phenols and ortho-tri-substituted lower alkyl phenols | about 40–75 | about 45–75 |

The most preferred monofunctional phenol is 2,6-dimethylphenol. The most preferred ortho-monosubstituted (lower alkyl) phenol is o-cresol. The most preferred para-substituted lower alkyl phenols are p-cresol and 3,4-dimethyl phenol (3,4-xylenol). The most preferred para-substituted multi-ring compound is 5-indanol. The most preferred ortho-di-substituted lower alkyl phenol is 2,3-dimethylphenol. The most preferred ortho-tri-substituted lower alkyl phenol is 2,3,5-trimethylphenol. It is preferred to employ a mixture of both.

In making the present class of alkali-soluble novolak resins, the monomeric phenolic precursors were reacted with an aldehyde source.

Any conventional aldehyde source used to make novolak resins may be employed herein. Formaldehyde, paraformaldehyde, acetaldehyde, haloacetaldehyde such as chloroacetaldehyde, trioxane, benzaldehydes, and the like and mixture thereof are examples of known novolak reins. Formaldehyde is the preferred aldehyde source.

The reaction mixture usually also contains an acid catalyst and may include a solvent. Known acid catalysts used for making novolaks may be suitable for making these novolak resins of the present invention. Any conventional solvent used in novolak-forming reactions may also be used herein. Preferred solvents are alcoholic or ethereal solvents with boiling points between 80°-220° C. The most preferred solvents are ethanol, butanol, and 1-methoxy-2-propanol (also known as propylene glycol monomethyl ether), dipropylene glycol monomethyl ether, or other solvents. The mixture is then preferably heated to a temperature in the range from about 60° C. to about 120° C., more preferably from about 65° C. to about 99° C., for the novolak-forming condensation polymerization reaction to occur. If any aqueous medium is used instead of an organic solvent, the reaction temperature is usually maintained at reflux, e.g. about 95° C. to 110° C. The reaction time will depend on the specific reactants used and the ratio of aldehyde source to phenolic monomers. The mole ratio of aldehyde source to total phenolic moieties is generally about 1.01:1 to about 1.3:1, preferably from about 1.02:1 to about 1.25:1. Reaction times from 3 to 20 hours are generally suitable.

The above-discussed resins of the present invention may be mixed with photoactive compounds to make radiation-sensitive mixtures which are useful as positive acting photoresists. One preferred class of photoactive compounds (sometimes called sensitizers) is o-quinonediazide compounds particularly esters derived from polyhydric phenols, alkyl-polyhydroxyphenones, aryl-polyhydroxyphenones, and the like which can contain up to six or more sites of esterification. The most preferred o-quinonediazide esters are derived from o-naphthoquinone-(1,2)-diazide-4-sulfonic acid and o-naphthoquinone-(1,2)-diazide-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-5-sulfonic acid esters, 2,4-dihydroxybenzophenone 1,2-naphthoquinonediazide-5-sulfonic acid esters, 2,3,4-trihydroxyphenyl hexyl ketone 1,2-naphthoquinonediazide-4-sulfonic acid esters, 2,3,4-trihydroxybenzophenone 1,2-naphthoquinonediazide-4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinonediazide-5-sulfonic acid esters, 2,3,4,4'-tetra-hydroxy-benzophenone 1,2-naphthoquinonediazide-5-sulfonic acid esters, 2,3,4,4'-tetrahydroxybenzophenone 1,2-naphthoquinonediazide-4-sulfonic acid esters, 2,2',3,4',6'-pentahydroxybenzophenone 1,2-naphthoquinonediazide-5-sulfonic acid esters and 2,3,3'4,4',5'-hexahydroxypenzophenone 1,2-naphthoquinonediazide-5-sulfonic acid esters; 1,2-quinonediazidesulfonic acid esters of bis[(poly)hydroxyphenyl]alkanes such as bis(p-hydroxyphenyl)-methane 1,2-naphthoquinonediazide-4-sulfonic acid esters, bis(2,4-dihydroxyphenyl)methane 1,2-naphthoquinonediazide-5-sulfonic acid esters, bis(2,3,4-trihydroxyphenyl)methane 1,2-naphthoquinonediazide--sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-sulfonic acid esters, 2,2-bis(2,3,4-trihydroxyphenyl)propane 1,2-naphthoquinonediazide--sulfonic acid esters, 2,6-bis-[(2,3,4-trihydroxyphenyl)methyl]-4-methylphenol 1,2-naphthoquinonediazide-5-sulfonic acid esters, and 2,6-bis [2,4,6-trihydroxyphenyl)methyl]-4-methylphenol 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339-353 (1965), John Wiley & Sons (New York) or in S. Deforest, "photoresist", 50, (1975), MacGraw-Hill, Inc. (New York). In addition, these materials may be used in combinations of two or more. Further, mixtures of substances formed when less than all esterification sites present on a particular polyhydric phenol, alkyl-polyhydroxyphenone, aryl-polyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta- and hexa-esters of polyhydroxy compounds having at least 2 hydroxyl groups, i.e. about 2 to 6 hydroxyl groups, are most preferred.

Among these most preferred 1,2-naphthoquinone-5-diazide compounds are 2,3,4-trihydroxybenzophenone 1,2-naphthoquinonediazide-5-sulfonic acid esters; 2,2',4,4'-tetrahydroxybenzophenone 1,2-naphthoquinonediazide-5-sulfonic acid esters; 2,6-bis-[(2,3,4-trihydroxyphenyl)methyl]-4-methylphenol 1,2-naphthoquinonediazide-5-sulfonic acid esters; and 2,6-bis[2,4,6-trihydroxyphenyl)methyl]-4-methylphenol 1,2-naphthoquinonediazide-5-sulfonic acid esters. These 1,2-quinonediazide compounds may be used alone or in combination of two or more.

Another preferred 1,2-naphthoquinone-5-diazide compounds are phenol 1,2-naphthoquinonediazide-5-sulfonic acid ester and bis[4-(2,6-dimethylphenol)]-4-catehol methane 1,2-naphthoquinone-5-diazide sulfonic acid esters.

Another preferred class of photoactive o-quinonediazide compounds is prepared by condensing spirobiindane or spirobichroman derivatives with 1,2-naphthoquinonediazido-4-sulfonyl chloride or 1,2-naphthoquinonediazide-5-sulfonyl chloride or a mixture thereof to make compounds of formula (A) shown below:

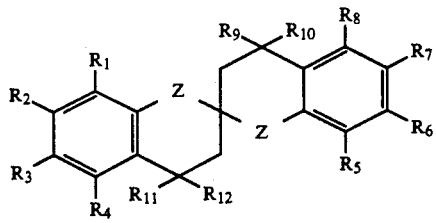 (A)

wherein $R_1$ to $R_8$ are independently hydrogen, a hydroxyl group, a halogen atom, an alkyl group, an alkoxy group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, a nitro group, an acyl group, an alkyloxycarbonyl group, an aryloxycarbonyl group, an acyloxy group,

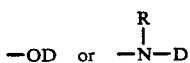

wherein R is hydrogen, or an alkyl group, and D is a 1,2-anphthoquinonediazido-5-sulfonyl group or a 1,2-naphthoquinonediazido-4-sulfonyl group); $R_9$ to $R_{12}$ are independently hydrogen or a lower alkyl group; and Z is oxygen or a single bond (i.e. The latter forms a five-member ring); provided that at least one of $R_1$ to $R_8$ is

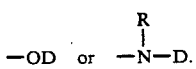

The halogen represented by $R_1$ to $R_8$ in the formula (A) is preferably chlorine, bromine or iodine.

The alkyl group si preferably an alkyl group having 1 to 4 carbon atoms, such as methyl, ethyl, propyl, isopropyl, n-butyl, isobutyl, sec-butyl and tert-butyl.

The alkoxy group is preferably an alkoxy group having 1 to 4 carbon atoms, such as methoxy, ethoxy, hydroxyethoxy, propoxy, hydroxypropoxy, isopropoxy, n-butoxy, isobutoxy, sec-butoxy and tert-butoxy.

The aralkyl group is preferably a benzyl group, a phenethyl group or a benzhydryl group.

The aryl group is preferably phenyl, tolyl, hydroxyphenyl or naphthyl.

The monoalkylamino group is preferably a monoalkylamino group having 1 to 4 carbon atoms, such as monomethylamino, monoethylamino, monopropylamino, monoisopropylamino, mono-n-butylamino, monoisobutylamino, mono-sec-butylamino, or mono-tert-butylamino.

The dialkylamino group is preferably a dialkylamino group with each akyl substituent having 1 to 4 carbon atoms, such as dimethylamino, diethylamino, dipropylamino, di-isopropylamino, di-n-butylamino, di-iso-butylamino, di-sec-butylamino, or di-tert-butylamino.

The acylamino group is preferably an aliphatic group-substituted acylamino group such as acetylamino, propionylamino, butylamino, isobutylamino, isovalerylamino, pivaloylamino or valerylamino, or an aromatic group-substituted acylamino group such as benzoylamino or toluoylamino.

The alkylcarbamoyl group is preferably an alkylcarbamoyl group having 2 to 5 carbon atoms, such as methylcarbamoyl, ethylcarbamoyl, propylcarbamoyl, isopropylcarbamoyl, n-butylcarbamoyl, isobutylcarbamoyl, sec-butylcarbamoyl, or tert-butylcarbamoyl.

The arylcarbamoyl group is preferably phenylcarbamoyl or tolylcarbamoyl.

The alkylsulfamoyl group is preferably an alkylsulfamoyl group having 1 to 4 carbon atoms, such as methylsulfamoyl, ethylsulfamoyl, propylsulfamoyl, isopropylsulfamoyl, n-butylsulfamoyl, sec-butylsulfamoyl, or tert-butylsulfamoyl.

The arylsulfamoyl group is preferably phenylsulfamoyl or tolylsulfamoyl.

the acyl group is preferably an aliphatic acyl group having 1 to 5 carbon atoms, such as formyl, acetyl, propionyl, butyryl, isobutyryl, valeryl, isovaleryl or pvialoyl, or an aromatic acyl group, such as benzoyl, toluoyl, salicyloyl, or naphthoyl.

The alkyloxycarbonyl group is preferably an alkyloxycarbonyl group having 2 to 5 carbon atoms, such as methoxycarbonyl, ethoxycarbonyl, propoxycarbonyl, isopropoxycarbonyl, n-butoxycarbonyl, isobutoxycarbonyl, sec-butoxycarbonyl, or tert-butoxycarbonyl.

The aryloxycarbonyl group is preferably phenoxycarbonyl.

The acyloxy group is preferably an aliphatic acyloxy group having 2 to 5 carbon atoms, such as acetoxy, propionyloxy, butyryloxy, isobutyryloxy, valeryloxy, isovaleryloxy or pivaloyloxy, or an aromatic acyloxy group such as benzoyloxy, toluoyloxy, or naphthoyloxy.

The lower alkyl group represented by $R_9$ to $R_{12}$ in the formula (A) is preferably an alkyl group having 1 to 4 carbon atoms, such as methyl, ethyl, propyl, isopropyl, butyl, isobutyl, sec-butyl, or tert-butyl.

In the formula (A) above, $R_1$ to $R_8$ are preferably a hydrogen atom, a hydroxy group or an —OD group wherein D is as defined above, and $R_9$ to $R_{12}$ are preferably a hydrogen atom or a methyl group. R is preferably an alkyl group having 1 to 4 carbon atoms, such as a methyl, ethyl, n-propyl, isopropyl, n-butyl, isobutyl, sec-butyl, or t-butyl group.

The proportion of the sensitizer compound in the radiation-sensitive mixture may preferably range from about 5 to about 40%, more preferably from about 10 to about 25% by weight of the solids or nonvolatile (e.g., nonsolvent) content of the radiation-sensitive mixture. The proportion of total binder resin of this present invention in the radiation-sensitive mixture may preferably range from about 60 to about 95%, more preferably, from about 75 to 90% of the solids or nonvolatile (e.g., excluding solvents) content of the radiation-sensitive mixture.

These radiation-sensitive mixtures may also contain conventional photoresist composition ingredients such as other resins, solvents, actinic and contrast dyes, antistriation agents, plasticizers, speed enhancers, and the like. These additional ingredients may be added to the binder resin and sensitizer solution before the solution is coated onto the substrate.

Other binder resins may also be added beside the resins of the present invention mentioned above. Examples include phenolic-formaldehyde resins, cresol-formaldehyde resins, phenol-cresol-formaldehyde resins and polyvinyl phenol resins commonly used in the photoresist art. Haloacetaldehyde and other aldehyde sources may be used instead of formaldehyde for making these optional resins. If other binder resins are present, they will replace a portion of the binder resins of the present invention. Thus, the total amount of the binder resin in the radiation-sensitive composition will be from about 60% to about 95% by weight of the total nonvolatile solids content of the radiation-sensitive composition.

The resins and sensitizers are generally dissolved in a solvent or solvents to facilitate their application to the substrate. Examples of known photoresist solvents include methoxyacetoxy propane, ethyl cellosolve acetate, n-butyl acetate, cyclopentanone, cyclohexanone, methyl ethyl ketone, diglyme, ethylene glycol monomethyl ether, ethylene glycol monoethyl ether, methyl lactate, ethyl lactate, ethyl 3-ethoxy propionate, propylene glycol alkyl ether acetates, xylene, or mixtures thereof and the like. The preferred solvent is ethyl lactate alone or in combination with ethyl 3-ethoxy propionate. The preferred amount of solvent may be from about 50% to about 500%, or higher, by weight, more preferably, from about 100% to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400–460 nm [e.g. Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g., 2,5-diphenyloxazole (PPO-Chem. Abs. Reg. No. 92-71-7) and 2-(4-biphenyl)-6-phenyl-benzoxazole (PBBO-Chem. Abs. Reg. No. 17064-47-0)]. The amount of actinic dyes may be up to 10% weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. No. 42514), Oil Blue N (C.I. No. 61555) and Calco Red A (C.I. No. 26125) up to 10% weight levels, based on the combined weight of resin and sensitizer.

Anti-striation agents level out the photoresist coating or film to a uniform thickness. Anti-striation agents may be used up to five percent weight levels, based on the combined weight of resin and sensitizer. One suitable class of anti-striation agents is nonionic silicon-modified polymers. Nonionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-($\beta$-chloroethyl)-ester; stearic acid; dicamphor; polypropylene; acetal resins; phenoxy resins; and alkyl resins up to 10% weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e., in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid at weight levels of up to 20%, based on the combined weight of resin and sensitizer. Other known speed enhancers include polyhydroxy compounds such as resorcinol, phloroglucinol, 2,3,4-trihydroxybenzophenone, 2,3,4,4'-tetrahydroxybenzophenone, 2,3,4,3',4',5'-hexahydroxybenzophenone, acetone pyrogallol condensate resins, and the like. Preferred speed enhancers include 2,6-bis[(2,3,4-trihydroxyphenyl)methylene]-4-methylphenol and 1-[1'methyl-1'-(4'-hydroxyphenyl)ethyl]4-[1'1'-bis(4-hydroxyphenyl) ethyl] (also known as phenol, 4,4'-[1-[4-[1-(4-hydroxyphenyl)-1-methylethyl]-phenyl]ethylidene]bis-or TRISP-PA). (This latter compound has CAS No. 110 726-28-8.)

The prepared radiation-sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin-speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° C. to 125° C. until substantially all the solvent has evaporated and only a uniform light-sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. In some instances, a post-exposure bake at a temperature about 10° C. higher than the soft bake temperature is used to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hdyroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated and imaged wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered, hydrofluoric acid etching solution or plasma gas etch.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLES 1-92

A. Preparation of Novolak Binder Resins

Ninety-two phenolic formaldehyde novolak binder resins were prepared and recovered by the following general procedure.

A mixture of the desired phenolic monomers were charged to a 500 ml three neck, round bottom flask. A solvent (chosen from either propylene glycol monomethyl ether or dipropylene glycol monomethyl ether), if used, was charged at this time. Then, the formaldehyde solution (37% $CH_2O$ by weight) and the catalyst (oxalic acid dihydrate) were charged to the flask. Mechanical stirring, temperature measurement, and reflux equipment were also attached to the flask. The flask was placed into a heated oil bath at 120° C. and heated at reflux for 18 hours. Following this, the condenser was replaced with a distillation head and receiver. The temperature of the oil bath was raised to 200° C. for 2 hours while the low boiling volatiles are distilled into the receiver as a condensate. After this atmospheric distillation, a fresh receiver was attached to the distillation apparatus and a vacuum source was attached to the new receiver. The distillation was continued while the reactor was heated to 220° C., and the pressure was decreased to <2 mm Hg. High boiling volatile impurities were thus removed. This second distillation step was maintained for 4 hours. The flask was then cooled and the novolak binder resin was recovered as a solid from the flask.

The individual percentage by weight (rounded off to the nearest whole percent) of each phenolic monomer as to the total of the phenolic monomers used in these novolak polymers are listed in Table I below. The following labels are used to represent the phenolic monomers: 2,6-DMP is used to represent 2,6-dimethylphenol; oC means o-Cresol; pC means p-Cresol; pC dimer means para-cresol dimer or 2,2'-dihydroxy-5,5'-dimethyl diphenyl methane; 3,4-DMP means 3,4-dimethylphenol; 2,5-DMP means 2,5-dimethylphenol; 2,3-DMP means 2,3-dimethylphenol; 2,3,5-TMP means 2,3,5-trimethylphenol; mC means m-Cresol The formaldehyde to total phenolics charge (F/P) is the molar ratio of formaldehyde to the total number of moles of all of the phenolic monomers. The catalyst charge (Cat/P) is the moles of oxalic acid dihydrates per total number of moles of the phenolic monomers. Solvent means the total grams of the selected solvent per total number of moles of the phenolic monomers.

TABLE I

| | | | | Description of Novalak Binder Resins. | | | | | | | | |
|---|---|---|---|---|---|---|---|---|---|---|---|---|
| Example | 2,6-DMP | oC | pC | pC Dimer | 3,4-DMP | 2,5-DMP | 2,3-DMP | 2,3,5-TMP | mC | Solvent | F/P | Cat/P |
| 1 | 5% | 23% | 46% | | | | 26% | | | 60.0 | 1.00 | 0.01 |
| 2 | 5% | 18% | 77% | | | | | | | 100.0 | 1.00 | 0.01 |
| 3 | 3% | 19% | 79% | | | | | | | | 1.00 | 0.01 |
| 4 | 5% | 18% | 77% | | | | | | | | 1.00 | 0.01 |
| 5 | 1.0% | 19% | 81% | | | | | | | | 0.98 | 0.01 |
| 6 | 1.0% | 19% | 81% | | | | | | | | 1.23 | 0.01 |
| 7 | 11% | 13% | 71% | | | | | | 5% | | 1.04 | 0.01 |
| 8 | 6% | 18% | 77% | | | | | | | | 1.06 | 0.01 |
| 9 | 12% | 12% | 66% | | | | | | 10% | | 1.05 | 0.01 |
| 10 | 17% | | 70% | | | | | | 14% | | 1.05 | 0.01 |
| 11 | 12% | 29% | 49% | | | | | | 10% | | 1.05 | 0.01 |
| 12 | 4% | 61% | 35% | | | | | | | | 1.05 | 0.10 |
| 13 | 4% | 51% | 45% | | | | | | | 50.0 | 1.05 | 0.05 |
| 14 | 4% | 48% | 5% | | 43% | | | | | 50.0 | 1.05 | 0.05 |
| 15 | 4% | 49% | 14% | | 32% | | | | | 50.0 | 1.05 | 0.05 |
| 16 | 4% | 49% | 24% | | 22% | | | | | 50.0 | 1.05 | 0.05 |
| 17 | 4% | 30% | 44% | | | 22% | | | | 50.0 | 1.05 | 0.05 |
| 18 | 4% | 10% | 43% | | | 43% | | | | 50.0 | 1.05 | 0.05 |
| 19 | 4% | 20% | 43% | | | 32% | | | | 50.0 | 1.05 | 0.05 |
| 20 | 4% | | 42% | | | 54% | | | | 50.0 | 1.05 | 0.05 |
| 21 | 4% | 30% | 44% | | | | 22% | | | 50.0 | 1.05 | 0.05 |
| 22 | 4% | 20% | 43% | | | | 32% | | | 50.0 | 1.05 | 0.05 |
| 23 | 4% | 10% | 43% | | | | 43% | | | 50.0 | 1.05 | 0.05 |
| 24 | 4% | 1.0% | 42% | | | | 53% | | | 50.0 | 1.05 | 0.05 |
| 25 | 4% | 29% | 43% | | | | | 24% | | 50.0 | 1.05 | 0.05 |
| 26 | 4% | 19% | 42% | | | | | 35% | | 50.0 | 1.05 | 0.05 |

TABLE I-continued

Description of Novalak Binder Resins.

| Example | 2,6-DMP | oC | pC | pC Dimer | 3,4-DMP | 2,5-DMP | 2,3-DMP | 2,3,5-TMP | mC | Solvent | F/P | Cat/P |
|---|---|---|---|---|---|---|---|---|---|---|---|---|
| 27 | 4% | 10% | 41% | | | | | 45% | | 50.0 | 1.05 | 0.05 |
| 28 | 4% | | 40% | | | | | 56% | | 50.0 | 1.05 | 0.05 |
| 29 | 4% | 22% | 18% | | | | | 56% | | 50.0 | 1.05 | 0.05 |
| 30 | 4% | 40% | | | | | | 56% | | 50.0 | 1.05 | 0.05 |
| 31 | 4% | 1.0% | 41% | | | | 31% | 23% | | 50.0 | 1.05 | 0.05 |
| 32 | 4% | 23% | | | | | 40% | 33% | | 50.0 | 1.05 | 0.05 |
| 33 | 8% | 19% | | | | | 40% | 33% | | 50.0 | 1.05 | 0.05 |
| 34 | 8% | 10% | | | | | 49% | 33% | | 50.0 | 1.05 | 0.05 |
| 35 | 8% | | | | | | 58% | 34% | | 50.0 | 1.05 | 0.05 |
| 36 | 8% | | | | | | 68% | 24% | | 50.0 | 1.05 | 0.05 |
| 37 | 8% | | | | | | 70% | 22% | | 50.0 | 1.05 | 0.05 |
| 38 | 8% | | | | | | 74% | 19% | | 50.0 | 1.05 | 0.05 |
| 39 | 8% | | | | | | 76% | 16% | | 50.0 | 1.05 | 0.05 |
| 40 | 8% | | | | | | 79% | 13% | | 50.0 | 1.05 | 0.05 |
| 41 | 12% | | | | | | 75% | 13% | | 50.0 | 1.05 | 0.05 |
| 42 | 8% | 10% | | | | | 39% | 43% | | 50.0 | 1.05 | 0.05 |
| 43 | 8% | 19% | | | | | 19% | 54% | | 50.0 | 1.05 | 0.05 |
| 44 | 8% | 2% | 9% | | | | 49% | 33% | | 50.0 | 1.05 | 0.05 |
| 45 | 8% | 2% | 9% | | | | 54% | 27% | | 50.0 | 1.05 | 0.05 |
| 46 | 8% | 2% | 18% | | | | 50% | 22% | | 50.0 | 1.05 | 0.05 |
| 47 | 4% | 1.0% | 42% | | | | 53% | | | 50.0 | 1.05 | 0.05 |
| 48 | 4% | 1.0% | 37% | | | | 58% | | | 50.0 | 1.05 | 0.05 |
| 49 | 4% | 1.0% | 36% | | | | 36% | 23% | | 50.0 | 1.05 | 0.05 |
| 50 | 4% | 56% | 40% | | | | | | | | 1.05 | 0.00 |
| 51 | 4% | 56% | 40% | | | | | | | | 1.05 | 0.02 |
| 52 | 4% | 56% | 40% | | | | | | | | 1.05 | 0.03 |
| 53 | 4% | 53% | 38% | | | | | | 5% | | 1.05 | 0.03 |
| 54 | 13% | 44% | 40% | | | | | | 3% | | 1.05 | 0.03 |
| 55 | 9% | 41% | 51% | | | | | | | | 1.05 | 0.03 |
| 56 | 7% | 32% | 57% | | | | | | 5% | | 1.05 | 0.03 |
| 57 | 11% | 27% | 62% | | | | | | | | 1.10 | 0.10 |
| 58 | 4% | 54% | 39% | | | | | | 2% | | 1.05 | 0.03 |
| 59 | 9% | 41% | 51% | | | | | | | | 1.05 | 0.05 |
| 60 | 4% | 56% | 40% | | | | | | | | 1.10 | 0.05 |
| 61 | 4% | 76% | 20% | | | | | | | | 1.08 | 0.07 |
| 62 | 4% | 66% | 30% | | | | | | | | 1.10 | 0.05 |
| 63 | 5% | 56% | 40% | | | | | | | | 1.05 | 0.05 |
| 64 | 4% | 76% | 20% | | | | | | | | 1.05 | 0.10 |
| 65 | 4% | 56% | 40% | | | | | | | | 1.10 | 0.10 |
| 66 | 4% | 76% | 20% | | | | | | | | 1.08 | 0.07 |
| 67 | 4% | 66% | 30% | | | | | | | | 1.10 | 0.10 |
| 68 | 4% | 76% | 20% | | | | | | | | 1.05 | 0.05 |
| 69 | 4% | 46% | 50% | | | | | | | | 1.08 | 0.07 |
| 70 | 4% | 46% | 50% | | | | | | | | 1.05 | 0.03 |
| 71 | 4% | 36% | 60% | | | | | | | | 1.05 | 0.05 |
| 72 | 4% | 51% | 45% | | | | | | | | 1.06 | 0.03 |
| 73 | 4% | 37% | 41% | | 18% | | | | | | 1.05 | 0.05 |
| 74 | 4% | 74% | | | | 22% | | | | | 1.05 | 0.05 |
| 75 | 6% | 70% | 25% | | | | | | | | 1.05 | 0.07 |
| 76 | 4% | 53% | 38% | | | | | | 5% | | 1.06 | 0.05 |
| 77 | 9% | 37% | 41% | | | | 10% | | 2% | | 1.05 | 0.05 |
| 78 | 8% | 44% | 43% | | | | | | 5% | | 1.05 | 0.05 |
| 79 | 9% | 43% | 29% | | | | 19% | | | | 1.05 | 0.05 |
| 80 | 4% | 50% | 28% | | | | 18% | | | | 1.05 | 0.05 |
| 81 | 4% | 38% | 32% | | | | 21% | | 5% | | 1.05 | 0.05 |
| 82 | 13% | 28% | 59% | | | | | | | | 1.05 | 0.05 |
| 83 | 6% | 33% | 62% | | | | | | | | 1.06 | 0.05 |
| 84 | 7% | 43% | 50% | | | | | | | | 1.05 | 0.05 |
| 85 | 8% | 48% | 44% | | | | | | | | 1.05 | 0.05 |
| 86 | 8% | 45% | 48% | | | | | | | | 1.06 | 0.05 |
| 87 | 8% | 2% | | 19% | | | 50% | 22% | | 50.0 | 1.05 | 0.05 |
| 88 | 8% | 2% | | 19% | | | 50% | 22% | | 50.0 | 1.05 | 0.03 |
| 89 | 8% | 20% | | 19% | | | 30% | 23% | | 50.0 | 1.05 | 0.05 |
| 90 | 8% | 6% | | 14% | | | 50% | 22% | | 50.0 | 1.05 | 0.05 |
| 91 | 8% | 11% | | 19% | | | 51% | 11% | | 50.0 | 1.05 | 0.05 |
| 92 | 8% | 6% | | 24% | | | 51% | 11% | | 50.0 | 1.05 | 0.05 |

B. Evaluation of the Novolak Binder Resins

The novolak binder resins prepared above were evaluated for yield, molecular weight, softening point, and Time to Clear ($T_c$) in a photoresist developer. The determined values are given in Table II below.

Yield is the proportion of the resin (i.e., free of unreacted monomer) recovered relative to the molar amount of the total monomer) recovered relative to the molar amount of the total monomers charged into the reaction vessel. Molecular weight was determined using gel Permeation Chromatography (GPC) with Tetrahydrofuran (THF) as the mobile phase. A four column set was used (PL Gel 10,000, 1,000, 500, and 50) with a refractive index detector. The softening point of the novolak polymers was determined using the ball and ring method detailed in ASTM D 3642-83.

The Time Clear ($T_c$) for the novolak resins was determined measuring the time required for a 1 micron resin film coated onto a 100 mm silicon wafer to dissolve into an aqueous tetramethylammonium hydroxide (TMAH) solution of 0.305 normality. The wafers were coated on a Soletec spin coater by applying 3 ml of a resin solution in ethylene glycol ethyl ether acetate (EGMEA) to the static wafer. The wafers were then spun at 500 rpm to spread the film and finally at 3,000–6,000 rpm to give the 1 micron film. These were softbaked on a vacuum chuck hot plate at 100° C. for 60 seconds. Film thicknesses were determined using a Dektac profilometer and a Gaertner elispometer. The coated wafers were placed in the developer solution with good agitation and the time recorded. The elapsed time was recorded when the film completely dissolved.

TABLE II

Functional Data for Novolak Binder Resins.

| Example | Yield | Mw | SP | Tc |
|---|---|---|---|---|
| 1 | 67.50% | Not Determined | 87.0 | >500 |
| 2 | 83.90% | 905 | 104.0 | >500 |
| 3 | 91.60% | 1005 | 113.0 | >500 |
| 4 | 93.20% | 941 | 111.0 | >500 |
| 5 | 95.50% | 1217 | 135.0 | >500 |
| 6 | 94.00% | 1193 | 135.0 | >500 |
| 7 | 93.50% | 1405 | 129.0 | >500 |
| 8 | 93.80% | 1114 | 129.0 | >500 |
| 9 | 94.20% | 2418 | 138.0 | >500 |
| 10 | 93.70% | 2547 | 135.0 | >500 |
| 11 | 95.10% | 2789 | 138.0 | 27 |
| 12 | 97.35% | 4345 | 160.5 | 42 |
| 13 | 97.07% | 1900 | 138.7 | 12 |
| 14 | 98.78% | 1896 | 149.4 | 525 |
| 15 | 97.58% | 1752 | 143.8 | 40 |
| 16 | 98.33% | 1929 | 144.5 | 33 |
| 17 | 97.39% | 1982 | 151.0 | 25 |
| 18 | 97.00% | 2001 | 158.6 | 59 |
| 19 | 97.76% | 1881 | 152.5 | 22 |
| 20 | 97.40% | 2424 | 168.0 | Solvent Insoluble |
| 21 | 97.51% | 2005 | 144.0 | 14 |
| 22 | 97.20% | 2000 | 146.6 | 17 |
| 23 | 97.11% | 2104 | 150.8 | 33 |
| 24 | 96.67% | 1871 | 153.9 | 31 |
| 25 | 97.39% | 2657 | 160.4 | 47 |
| 26 | 97.17% | 2782 | 169.9 | 446 |
| 27 | 97.73% | 3219 | 182.6 | >>1000 |
| 28 | 97.46% | 3549 | 191.0 | >>1000 |
| 29 | 96.90% | 3550 | 184.5 | 810 |
| 30 | 97.49% | 3123 | 174.4 | 42 |
| 31 | 96.18% | 2253 | 170.8 | 1752 |
| 32 | 98.70% | 2644 | 178.0 | 20 |
| 33 | 98.32% | 2397 | 174.6 | 16 |
| 34 | 98.53% | 3008 | 185.8 | 43 |
| 35 | 98.20% | 3837 | 201.0 | 808 |
| 36 | 98.41% | 3707 | 198.5 | 192 |
| 37 | 98.98% | 3845 | 194.1 | 180 |
| 38 | 98.82% | 3687 | 195.1 | 127 |
| 39 | 98.99% | 4011 | 195.4 | 124 |
| 40 | 99.10% | 4098 | 193.5 | 108 |
| 41 | 98.96% | 3093 | 185.0 | 42 |
| 42 | 98.43% | 3293 | 193.0 | 236 |
| 43 | 97.08% | 3145 | 180.4 | 505 |
| 44 | 98.23% | 3120 | 188.9 | 164 |
| 45 | 98.05% | 2834 | 187.6 | 79 |
| 46 | 97.94% | 2355 | 175.5 | 32 |
| 47 | 97.46% | 2136 | 158.1 | 35 |
| 48 | 97.10% | 1941 | 151.5 | 18 |
| 49 | 97.99% | 2157 | 169.0 | Not Determined |
| 50 | 94.64% | 1024 | 123.4 | 2 |
| 52 | 98.52% | 1955 | 146.3 | 15 |
| 53 | 97.69% | 2399 | 145.0 | 22 |
| 54 | 98.61% | 1917 | 146.0 | 69 |
| 55 | 97.72% | 1448 | 146.5 | 4950 |
| 56 | 97.83% | 1927 | 152.9 | 63500 |
| 57 | 98.79% | 5412 | 173.8 | 710 |
| 58 | 98.33% | 1896 | 151.1 | 61 |
| 59 | 99.23% | 1945 | 149.1 | 21 |
| 60 | 96.00% | 4211 | 162.1 | 13 |
| 61 | 98.85% | 4864 | 168.0 | 52 |
| 62 | 98.31% | 2741 | 157.0 | 61 |
| 63 | 99.22% | 3093 | 154.0 | 7 |

TABLE II-continued

Functional Data for Novolak Binder Resins.

| Example | Yield | Mw | SP | Tc |
|---|---|---|---|---|
| 64 | 99.78% | 4803 | 162.5 | 16 |
| 65 | 94.70% | 7379 | 171.0 | 37 |
| 66 | 99.16% | 4128 | 162.0 | 31 |
| 67 | 99.19% | 7576 | 171.0 | 38 |
| 68 | 99.08% | 2367 | 155.5 | 294 |
| 69 | 98.56% | 4229 | 173.1 | 274000 |
| 70 | 96.35% | 1779 | 150.3 | 23500 |
| 71 | 97.94% | 2713 | 157.0 | 91 |
| 72 | 97.42% | 2035 | 151.6 | 101 |
| 73 | 98.27% | 2367 | 151.0 | 9 |
| 74 | 98.96% | 2607 | 158.5 | 9 |
| 75 | 98.17% | 2296 | 156.4 | 49 |
| 76 | 98.17% | 3116 | 156.6 | 124 |
| 77 | 98.04% | 2581 | 152.9 | 31 |
| 78 | 98.05% | 3396 | 152.3 | 24 |
| 79 | 98.36% | 2588 | 152.1 | 15 |
| 80 | 98.15% | 2758 | 158.0 | 30 |
| 81 | 97.73% | 2798 | 160.0 | 148 |
| 82 | 98.52% | 2231 | 159.4 | 884 |
| 83 | 97.53% | 2123 | 154.6 | 131 |
| 84 | 97.92% | 2055 | 150.0 | 16 |
| 85 | 97.90% | Not Determined | 140.3 | 17 |
| 86 | 97.93% | Not Determined | 153.6 | 39 |
| 87 | 99.31% | 3015 | 186.0 | 380 |
| 88 | 98.51% | 2569 | 178.0 | 240 |
| 89 | 98.93% | 2433 | 168.0 | 39 |
| 90 | 99.01% | 2769 | 178.0 | 150 |
| 91 | 98.60% | 2720 | 172.0 | 77 |
| 92 | 99.55% | 2381 | 168.0 | 83 |

C. Preparation of Photoresists

Positive working photoresist compositions were prepared from (1) selected novolak resins made above, (2) photoactive compounds (PAC), (3) a leveling agent, and (4) solvent by the following general procedure. The proportions of the four components were kept consistent. Two photoactive compounds were used to prepare these photoresists. These two PAC's were (1) 2,3,4,4'-tetrahydroxybenzophenone esterified with 2.75 equivalents of 1,2-naphthoquinonediazide-5-sulfonyl-chloride (referred to as 2.75S-4HBP in Table III) and (2) 2,2',3,3'-tetrahydro3,3,3',3'-tetramethyl-1,1'-spirobi-(1H-indene)-5,5'6,6',7,7'-hexol (CAS Reg. No. 32717-33-0) esterified with 5 equivalents of 1,2-naphthoquinonediazide-5-sulfonyl chloride (referred to as PS-6 in Table III). The solvent used for each photoresist was EGMEA. An alkyd resin/silicone surfactant leveling agent (FLUORAD FC-430 produced by 3M) was added to each photoresist composition.

The chosen photoactive compound (PAC) was charged to a 50 ml brown glass bottle. A solution of the novolak resin in ethylene glycol methyl ether acetate (EGMEA) was added to this bottle to give the correct PAC/Resin ratio. The leveling agent (alkyd resin/silicone surfactant) was added to give a final concentration of 0.06 wt. %. Further solvent was added to give the correct solids content to allow coating of the composition to 1.2 microns on a silicon wafer. This final photoresist mixture was mixed until homogeneous and finally filtered through an 0.2 micron filter.

The photoresist formulations made are shown in Table III below. As can be seen, the column labeled resin example refers to the novolak binder resin identified in Table I above. The column labeled PAC Type refers to which of the two photoactive compounds was used in formulating the photoresist. The column PAC/Resin refers to the weight ratio of the selected PAC to the solid novolak resin in each final formulation.

D. Coating, Softbaking, Exposure, Post Exposure Baking, and Developing of the Photoresists Films of the formulated photoresist were prepared for imaging, exposed and developed according to the following general procedure:

The wafers were coated on a spin coater by applying 3 ml of a photoresist formulation shown in Table III to the static wafer. The wafer was then spun at 500 rpm to spread the film, and finally at 3,000-6,000 rpm to give a 1.2 micron film. These photoresist coated wafers were then softbaked on a vacuum chuck hot plate at 80° C. for 90 seconds to remove residual solvent. The softbaked wafers were exposed to 436 nm light (G-line) using either a Canon or a Nikon projection exposure tool with a numerical aperture of either 0.48 or 0.30. The term "Proj. N.A." in Table III refers to the specific projection exposure tool used. The exposure energy was controlled by the time a shutter was open allowing the light to strike the photoresist film. After completion of exposure, the wafers were subjected to a post exposure bake (PEB) to lessen or remove the standing waves from the exposure. This was done using the vacuum chuck hot plate at 120° C. for 60 seconds. Following the PEB, the wafers were developed using 0.261N tetramethylammonium hydroxide. This was done on a wafer developing station of a track system. The wafer was spun, sprayed with the developer for 5 seconds, spinning was stopped for the last 2 seconds of the spray. The wafer remained stationary for 60 seconds while development occurs. A deionized water rinse was applied for 20 seconds while spinning, followed by dry nitrogen gas to dry the wafer. The wafer, with the developed image, was removed for evaluation of the lithographic properties of the formulated photoresist.

E. Evaluation of the Photoresists

Each developed photoresist-coated substrate was evaluated for several important properties: film thickness remaining (FTR), optimum photospeed (Eopt), line/space pair resolution (Resolution), contact hole resolution (Contact Hole), profile of the imaged line/space pairs (Profile), scum remaining in the imaged line/space pairs (Scum), and resistance to flow when heated (Heat Resistance).

The film thickness remaining (FTR) is the photoresist film thickness retained by the coated substrate after the image development process. This is reported as a percentage of the photoresist film initially coated onto the substrate before exposure. The film thickness is measured using an elispometer and an assumed refractive index. Values for FTR which are less than 70% are unsuitable for further evaluation in most cases. A value of 0.0% indicates the photoresist film was completely removed by the developing conditions and further evaluation was impossible. The exact reason for these undesirable results is not known for each case; however, it is believed that they are due to poor PAC/resin interactions.

The optimum exposure energy (Eopt) was determined as the energy required to replicate the dimensions of the mask for line/space pairs. Values between 80-300 mJ/sq cm are acceptable for the evaluation. A value less than this indicates the photoresist film is too sensitive to the light while a value greater than this indicates the sensitivity is too low. Where all of the photoresist film was removed by development, no evaluation of photospeed could be made.

The resolving power (resolution) of the photoresist film is determined as the minimum line/space pair features which are cleared at the Eopt. These are reported as the distance between lines in microns. The ability of the photoresist to resolve contact hole features (contact hole) is reported as the minimum contact hole feature in microns that is cleared at the optimum exposure energy (Eopt). Where the photoresist film was completely removed during development, no resolution determination could be made. Generally, the lower the resolution values, the better the resist would perform.

The profile of the line/space pairs (profile) is evaluated as the ability of the photoresist to maintain a consistent width throughout the depth of the film. Highly sloped sidewalls are undesirable and rate a 1 on a scale of 1-5. Highly vertical sidewalls are very desirable and rate a value of 5. Intermediate profiles are given a rating between the two extremes.

The tendency of the photoresist film to form scum between the line/space pairs is reported as scum. Scum is the material remaining at the bottom of cleared features. While scum does not greatly influence the resolving power of the photoresist, it detracts from the usefulness of the photoresist for manufacturing. Photoresist films were little scumming was noted were given a value of 5 on a scale of 1-5. Photoresist films demonstrating a lot of scum formation were given a rating of 1. In cases where the photoresist film was completely removed by development, no rating could be given.

The ability of the developed photoresist image to resist deformation due to heat generated during process steps is known as heat resistance. This is determined by subjecting portions of the imaged wafer to a heated hot plate for 4 minutes. This is done for several temperatures (e.g., 100° C. to 150° C. range). The coated wafer chip is inspected for flow of the images (i.e., image deformation) adjacent to bulk areas of the film. The temperature, where significant flow of the featured sidewalls are noted, is referred to as its heat resistance limit. Values of 115°-120° C. are considered minimum for a commercial photoresist.

TABLE III

| Resist Example | Resin Example | PAC Type | PAC/Resin | Proj. N.A. | FTR (%) | Eopt (mJ/sq cm) | Resolution Line/Space (um) | Contact Hole (um) | Profile | Scum | Heat Resistance (C) |
|---|---|---|---|---|---|---|---|---|---|---|---|
| 1 | 21 | PS-6 | 20/80 | 0.48 | 85.7% | <<60 | — | — | — | — | 125 |
| 2 | 22 | PS-6 | 20/80 | 0.48 | 89.9% | <<60 | — | — | 4.8 | 4.8 | 125 |
| 3 | 23 | PS-6 | 20/80 | 0.48 | 93.2% | 90 | 0.57 | 0.65 | 3.0 | 4.8 | 125 |
| 4 | 24 | PS-6 | 20/80 | 0.48 | 9.18% | 75 | 0.57 | 0.70 | 3.5 | 4.8 | 130 |
| 5 | 25 | PS-6 | 20/80 | 0.48 | 93.7% | 100 | 0.55 | 0.75 | 5.0 | 4.5 | 130 |
| 6 | 26 | 2.75S-4HBP | 20/80 | 0.48 | 94.5% | >375 | — | 0.90 | 4.8 | 0.5 | 135 |
| 7 | 34 | 2.75S-4HBP | 26/74 | 0.48 | 95.8% | 80 | 0.60 | 0.75 | 2.8 | 5.0 | 155 |
| 8 | 36 | 2.75S-4HBP | 26/74 | 0.48 | 95.9% | 175 | 0.60 | 0.75 | 3.0 | 5.0 | 155 |

TABLE III-continued

Photoresist Evaluations

| Resist Example | Resin Example | PAC Type | PAC/Resin | Proj. N.A. | FTR (%) | Eopt (mJ/sq cm) | Resolution Line/Space (um) | Contact Hole (um) | Profile | Scum | Heat Resistance (C) |
|---|---|---|---|---|---|---|---|---|---|---|---|
| 9 | 37 | 2.75S-4HBP | 26/74 | 0.48 | 96.2% | 170 | 0.60 | 0.75 | 3.0 | 5.0 | 155 |
| 10 | 38 | 2.75S-4HBP | 26/74 | 0.48 | 95.9% | 140 | 0.60 | 0.80 | 3.0 | 5.0 | 155 |
| 11 | 42 | 2.75S-4HBP | 26/74 | 0.48 | 96.4% | 200 | 0.57 | 0.75 | 3.5 | 5.0 | 160 |
| 12 | 45 | 2.75S-4HBP | 26/74 | 0.48 | 96.0% | 115 | 0.57 | 0.70 | 3.0 | 5.0 | 155 |
| 13 | 52 | 2.75S-4HBP | 26/74 | 0.30 | 0.0% | — | — | — | — | — | — |
| 14 | 53 | 2.75S-4HBP | 26/74 | 0.30 | 70.0% | — | — | — | — | — | — |
| 15 | 54 | 2.75S-4HBP | 26/74 | 0.30 | 99.2% | 212 | 0.70 | 1.10 | 3.0 | 1.0 | <120 |
| 16 | 58 | 2.75S-4HBP | 26/74 | 0.30 | 99.4% | 134 | 0.80 | 1.20 | 3.0 | 1.0 | <120 |
| 17 | 59 | 2.75S-4HBP | 26/74 | 0.30 | 0.0% | — | — | — | — | — | — |
| 18 | 60 | 2.75S-4HBP | 26/74 | 0.28 | 0.0% | — | — | — | — | — | — |
| 19 | 61 | 2.75S-4HBP | 26/74 | 0.30 | 78.5% | 65 | — | — | — | — | — |
| 20 | 62 | 2.75S-4HBP | 26/74 | 0.30 | 93.2% | — | 0.90 | 1.00 | 1.0 | 4.0 | <120 |
| 21 | 63 | 2.75S-4HBP | 26/74 | 0.30 | 0.0% | — | — | — | — | — | — |
| 22 | 64 | 2.75S-4HBP | 26/74 | 0.30 | 0.0% | — | — | — | — | — | — |
| 23 | 67 | 2.75S-4HBP | 26/74 | 0.30 | 62.9% | <28 | — | — | — | — | — |
| 24 | 68 | 2.75S-4HBP | 26/74 | 0.30 | 99.6% | 407 | 0.70 | 1.20 | 3.0 | 3.0 | <120 |
| 25 | 71 | 2.75S-4HBP | 26/74 | 0.30 | 99.1% | 150 | 0.80 | 1.00 | 3.0 | 5.0 | <120 |
| 26 | 72 | 2.75S-4HBP | 26/74 | 0.30 | 99.3% | 239 | 0.70 | 1.10 | 4.0 | 1.0 | <120 |
| 27 | 75 | 2.75S-4HBP | 26/74 | 0.30 | 83.4% | 84 | 0.80 | — | 1.0 | 5.0 | <110 |
| 28 | 76 | 2.75S-4HBP | 26/74 | 0.30 | 99.5% | 238 | 0.70 | 0.90 | 4.0 | 5.0 | <120 |
| 29 | 77 | 2.75S-4HBP | 26/74 | 0.30 | 90.6% | 47 | 0.80 | 1.00 | 3.0 | 5.0 | <120 |
| 30 | 78 | 2.75S-4HBP | 26/74 | 0.30 | 0.0% | — | — | — | — | — | — |
| 31 | 79 | 2.75S-4HBP | 26/74 | 0.30 | 0.0% | — | — | — | — | — | — |
| 32 | 80 | 2.75S-4HBP | 26/74 | 0.30 | 76.9% | 42 | 0.80 | — | 1.0 | 5.0 | 110 |
| 33 | 81 | 2.75S-4HBP | 26/74 | 0.30 | 99.5% | 411 | 0.70 | — | 4.0 | 4.0 | <120 |
| 34 | 46 | PS-6 | 20/80 | 0.48 | 97.8% | 95 | 0.60 | 0.70 | 3.0 | 5.0 | 135 |
| 35 | 47 | PS-6 | 20/80 | 0.48 | 99.3% | 100 | 0.55 | 0.70 | 4.5 | 5.0 | 125 |
| 36 | 48 | PS-6 | 20/80 | 0.48 | 96.3% | <55 | 0.60 | 0.65 | 3.0 | 5.0 | 130 |
| 37 | 89 | PS-6 | 20/80 | 0.48 | 98.6% | 115 | 0.55 | 0.70 | 3.0 | 5.0 | 130 |
| 38 | 49 | 2.75S-4HBP | 26/74 | 0.48 | 99.6% | 245 | 0.55 | 0.70 | 4.5 | 3.0 | 130 |
| 39 | 88 | 2.75S-4HBP | 26/74 | 0.48 | 99.8% | 305 | 0.50 | 0.65 | 5.0 | 4.5 | 135 |
| 40 | 90 | 2.75S-4HBP | 26/74 | 0.48 | 99.6% | 140 | 0.55 | 0.70 | 4.5 | 4.6 | 135 |
| 41 | 91 | 2.75S-4HBP | 26/74 | 0.48 | 99.5% | 95 | 0.55 | 0.70 | 4.0 | 5.0 | 130 |
| 42 | 92 | 2.75S-4HBP | 26/74 | 0.48 | 99.5% | 115 | 0.55 | 0.65 | 5.0 | 4.0 | 130 |

RESIST EXAMPLE 43

The following phenolic monomers were charged to a 1 liter 3 neck, round bottom flask equipped with a Teflon coated thermocouple, mechanical stirrer, and reflux condenser:

| Phenol | Grams | Moles | Molar Ratio |
|---|---|---|---|
| o-Cresol | 5.00 | 0.046 | 0.022 |
| 2,3-Dimethylphenol | 140.78 | 1.150 | 0.556 |
| 2,6-Dimethylphenol | 22.52 | 0.184 | 0.089 |
| 2,3,5-Trimethylphenol | 62.96 | 0.462 | 0.222 |
| p-Cresol dimer | 52.77 | 0.231 | 0.111 |

Also charged to the same flask was oxalic acid dihydrate (11.48 grams, 0.0911 mole). After the thermocouple was placed into position in the flask, and the reflux condenser attached, the flask placed in an oil bath. The condenser cooling water was turned on and the oil bath warmed to 50° C. The monomer mixture was stirred and heated until completely homogeneous at 50° C. Formalin (36.8% CH$_2$O, 206.51 grams, 2.503 moles) was then charged to the mixture dropwise over a 90 min. period. After that addition, the reaction mixture was held at 50° C. for 1 hr. Following this, the oil bath was heated to 105° C. for an additional 2 hrs. Ethyl 3-ethoxypropionate (EEP, 69.00 g) was charged to the flask. Heating was continued at 105° C. for 16 more hours. The mixture was viscous. The reflux condenser was exchanged for a distillation head, condenser, and receiver. The oil bath was heated to 200° C. for 2 hrs. while the water from the reaction is distilled off. This condition was maintained for 2 hrs. from the point of reaching 200° C. The polymer is isolated by cooling the molten polymer to room temperature and removing it from the flask as a solid. Yield is measured as the amount of material retained in the flask. The resulting polymer had an Mw of 3,378, Mn of 1,541, and polydispersivity of 2.197 as measured by gel permeation chromatography.

A solution of the polymer in ethyl lactate (EL)/ethyl 3-ethoxy propionate (EEP) (70/30 by volume) at 30% solids was prepared and filtered through an 0.45 μm filter. This was coated onto a dehydrated 4" silicon wafer by placing 3 ml of this solution on the wafer, spinning the wafer at 4,500 rpm for 30 sec. and soft baking the wafer on a vacuum chuck hot plate at 100° C. for 60 sec. The resulting 1.0 μm film dissolved into 0.261 N tetramethylammonium hydroxide (TMAH) in 1,343 sec.

The following materials were charged to a clean one liter flask under yellow light:

| Material | Grams |
|---|---|
| 30% Solids novolak solution (80% EL/20% EEP vol. %) | 225.430 |
| 2,6-bis[(2,3,4-trihydroxyphenyl)methylene] 4-methyl phenol | 8.710 |
| 1-[1'-methyl-1'-(4'-hydroxyphenyl)ethyl] 4-[1',1'-bis-(4-hydroxyphenyl)ethyl] benzene (AKA TRISP-PA) | 6.640 |
| Phenol 1,2-naphthoquinonediazide-5-sulfonic acid ester | 1.700 |
| 2,6-bis-[(2,3,4-trihydroxyphenyl)methyl]-4-methylphenol 1,2-naphthoquinonediazide-5-sulfonic acid ester mixture (59% of hexa-ester, 12% of septa-ester, 12% of penta-ester, and 17% of unidentified residuals) | 15.300 |

-continued

| Material | Grams |
| --- | --- |
| Solvent mixture (80% EL/20% EEP by vol. %) | 112.590 |
| Leveling agent (FLUORAD FC-430) | 0.111 |

The mixture was stirred at 30°–40° C. until homogeneous. The dark red solution was placed in a pressure filter and filtered through an 0.20 μm membrane. The isolated photoresist was stored in a brown bottle to protect it from incident light.

Lithographic Evaluation

The photoresist was coated onto a dehydrated 4 inch (100 mm) silicon wafer by placing 3 ml of this solution on the wafer. The wafer was spun at approximately 4,500 rpm for 30 sec. and the wafer was softbaked on a vacuum chuck hot plate at 90° C. for 60 secs. This prebaked wafer was exposed on a photolithographic tool (i.e., the Canon g-line stepper, Model No. PLA-1550 Mark 3, with an NA=0.48). The mask used contains many feature types, one of which is parallel equal line/space pairs of dimensions varying from 10 to 0.2 μm.

The exposure was varied over a number of dies allowing the determination of an optimum exposure energy. Similarly, the focus was varied independently of exposure to determine the focus exposure latitude. The exposed wafer was heated in a post exposure bake at 125° C. for 60 sec. on a vacuum chuck hot plate. The coated, softbaked, exposed, and postbaked wafer was subjected to development with 0.261 N-tetramethylammonium hydroxide (TMAH) in a spray developing spinner. The development cycle was 3 sec. dispense at 500 RPM, 60 sec. hold, 20 secs. deionized water rinse at 1,000 rpm, and 10 sec. dry at 5,000 rpm.

The measured lithographic properties of this resist were as follows: optimum exposure energy for 1:1 replication of equal line/space pairs was 195 mJ/cm$^2$; minimum resolution 0.45 micron with thermal deformation temperature of 130° C.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

what is claimed is:

1. A radiation-sensitive composition dissolved in a solvent comprising an admixture of:
   (A) a photoactive compound and
   (B) an alkali-soluble novolak binder resin made by the condensation reaction of a mixture of phenolic monomers and phenolic dimers with at least one aldehyde source, said mixture of phenolic monomers and phenolic dimers comprising:
      (1) about 2–25% by weight of said mixture being at least one monofunctional phenolic monomer;
      (2) a mixture of difunctional phenolic monomers or dimers comprising:
         (a) about 0.1% to about 25% by weight of said total mixture being ortho-mono(lower alkyl) phenol;
         (b) about 10% to about 50% by weight of said total mixture being selected from the group consisting of a para-mono (lower alkyl) phenol, 2,2'-dihydroxy-5,5'-di(lower alkyl) diphenyl methane, 3,4-di(lower alkyl) phenol, 5-indanol, 3,4,5-tri(lower alkyl) phenol, and mixtures thereof; and
      (c) about 30% to about 80% by weight of the total mixture being 2,4,5-tri(lower alkyl) phenol, 2,3-di(lower alkyl) phenol, 2,5-di(lower alkyl) phenol, and mixtures thereof;
the amount of said aldehyde source being at least a stoichiometric amount to react with all of said phenolic moieties; and wherein the photoactive compound is from about 5% to about 40% by weight of the solids in said radiation-sensitive composition; and the alkali-soluble novolak resin is from about 95% to about 60% by weight of the solids in said radiation-sensitive composition.

2. The radiation-sensitive composition of claim 1 wherein said monofunctional phenolic monomer is selected from the group consisting of 2,6-dimethylphenol, 2,4-dimethylphenol, and mixtures thereof.

3. The radiation-sensitive composition of claim 2 wherein the percentage of said monofunctional phenolic monomer is from about 3% to about 22% by weight of said phenolic mixture.

4. The radiation-sensitive composition of claim 1 wherein the percentage of said difunctional phenolic monomers is from about 98% to about 85% by weight of said phenolic mixture.

5. The radiation-sensitive composition of claim 1 wherein said ortho-mono (lower alkyl) phenol is ortho-cresol.

6. The radiation-sensitive composition of claim 5 wherein the percentage of said ortho-cresol is from about 0.5% to about 15% by weight of said phenolic mixture.

7. The radiation-sensitive composition of claim 1 wherein said para-mono (lower alkyl) phenol is para-cresol.

8. The radiation-sensitive composition of claim 1 wherein said 2,2'-dihydroxy-5,5-di(lower alkyl) diphenyl methane is 2,2'-dihydroxy-5,5'-dimethyldiphenyl methane.

9. The radiation-sensitive composition of claim 1 wherein the percentage of said compounds of class 2(b) is from about 12% to about 45% by weight of said phenolic mixture.

10. The radiation-sensitive composition of claim 1 wherein said 2,3-di(lower alkyl) phenol is 2,3-dimethylphenol, and 2,5-di(lower alkyl) phenol is 2,5-dimethylphenol.

11. The radiation-sensitive composition of claim 1 wherein said novolak resin additionally contains up to about 15% by weight of at least one trifunctional phenolic monomer or at least one tetrafunctional phenolic dimer or mixtures thereof.

12. A radiation-sensitive composition useful as a positive-working photoresist dissolved in a solvent comprising an admixture of:
A. a photoactive compound; and
B. an alkali-soluble novolak binder resin made by the condensation reaction of phenolic monomers and phenolic dimers with an aldehyde source, said mixture of phenolic monomers and phenolic dimers comprising:
   (1) about 3 to about 22% by weight of said monomeric mixture of at least one monofunctional phenolic monomer selected rom the group consisting of 2,4-dimethylphenol, 2,6-dimethylphenol, and mixtures thereof;

(2) about 0.5% to about 15% by weight of said monomeric mixture being ortho-cresol;

(3) about 12% to about 45% by weight of said monomer mixture being a difunctional monomer selected from the group consisting of para-cresol, 2,2'-dihydroxy-5,5'-dimethyldiphenyl methane, 3,4-xylenol, 5-indanol, 3,4,5-trimethylphenol, and mixtures thereof; and (4) about 40% to about 75% by weight of said monomer mixture being a difunctional monomer selected from the group of 2,3,5-trimethylphenol and 2,3-dimethylphenol, and mixtures thereof;

wherein the mole ratio of said aldehyde source to total phenolic moieties is at least about 1.01:1 to about 1.3:1; and wherein the photoactive compound is from about 5% to about 40% by weight of the solids in said radiation-sensitive composition, and the alkali-soluble novolak resin is from about 95% to about 60% by weight of the solids in said radiation-sensitive composition.

* * * * *